(12) United States Patent  
Dyer et al.

(10) Patent No.: US 7,983,373 B2
(45) Date of Patent: Jul. 19, 2011

(54) CLOCK DISTRIBUTION FOR 10GBASE-T ANALOG FRONT END

(75) Inventors: Kenneth C. Dyer, Davis, CA (US); James M. Little, Sacramento, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 854 days.

(21) Appl. No.: 11/975,740

(22) Filed: Oct. 19, 2007

(65) Prior Publication Data

US 2008/0247497 A1    Oct. 9, 2008

Related U.S. Application Data

(60) Provisional application No. 60/900,180, filed on Feb. 7, 2007.

(51) Int. Cl.
*H04L 7/00*    (2006.01)

(52) U.S. Cl. ........ 375/356; 375/375; 375/258; 375/354; 375/348; 370/294

(58) Field of Classification Search .................. 375/375, 375/356, 354, 348; 370/294
See application file for complete search history.

(56) References Cited

U.S. PATENT DOCUMENTS

| | | | | |
|---|---|---|---|---|
| 5,361,277 A * | 11/1994 | Grover | ........................... | 375/356 |
| 5,864,592 A * | 1/1999 | Itri | ................. | 375/375 |
| 6,219,384 B1 * | 4/2001 | Kliza et al. | ..................... | 375/258 |
| 6,426,984 B1 * | 7/2002 | Perino et al. | .................... | 375/356 |
| 6,577,689 B1 * | 6/2003 | Smith et al. | .................... | 375/354 |
| 6,643,787 B1 * | 11/2003 | Zerbe et al. | .................... | 713/400 |
| 2006/0251194 A1 * | 11/2006 | Bublil et al. | ................... | 375/348 |
| 2008/0151792 A1 * | 6/2008 | Taich et al. | .................... | 370/294 |

* cited by examiner

*Primary Examiner* — Eva Y Puente
(74) *Attorney, Agent, or Firm* — Dorsey & Whitney LLP

(57) ABSTRACT

A 10GBASE-T clocking method that limits EMI and increases SNR, while reducing power and conserving chip space is provided. The method includes simultaneous clocking of transmitters in an analog front end of a 10 gigabit Ethernet. The method includes providing at least two channels to a 10GBase-T analog front end, where the channel has at least a transmitter port and a receiver port, and providing at least two phase interpreters to the analog front end, where each phase interpreter is dedicated to one receiver port. A central clock generator is disposed to distribute a transmit clock to the phase interpreters and to the transmitter ports, where the transmit clock is further provided to the receiver ports from the phase interpreters. Any clock delay between the clock generator and each channel is balanced and clock phases between the channels are matched.

19 Claims, 1 Drawing Sheet

CLOCK DISTRIBUTION FOR 10GBASE-T ANALOG FRONT END

CROSS-REFERENCE TO RELATED APPLICATIONS

This application is cross-referenced to and claims the benefit from U.S. Provisional Patent Application 60/900,180 filed Feb. 7, 2007, which is hereby incorporated by reference.

FIELD OF THE INVENTION

The invention relates generally to electronics clocking arrangements. More particularly, the invention relates to balancing clocking phases in a 10GBase-T analog front end of an electronic circuit.

BACKGROUND

In a synchronous digital system, the clock signal is used to define a time reference for the movement of data within that system. The clock distribution network distributes the clock signals from transmitters to all the elements needing such signals. Substrate noise and electro magnetic interference (EMI) in high-speed transceivers is a pervasive problem, where the signals from multiple transmitters can constructively interfere with each other. Such interference limits chip performance and reduces signal to noise ratios (SNR). Typically, multiple transmit clocks are used to managed the transmit clock phase of each channel with respect to the others in order to improve chip performance and EMI, however the existence of multiple clocks consumes valuable resources such as power and chip space.

Accordingly, there is a need to develop a clocking method that limits EMI and increases SNR, while reducing power and conserving chip space.

SUMMARY OF THE INVENTION

The current invention provides a method of simultaneous clocking of transmitters in an analog front end. In one aspect of the invention the analog front end can be a 10 gigabit Ethernet (10 GBase-T) analog front end. The invention includes providing at least two channels to the analog front end, where the channel has at least a transmitter port and a receiver port, and providing at least two phase interpreters to the analog front end, where each phase interpreter is dedicated to one receiver port. The invention includes providing a central clock generator disposed to distribute a transmit clock to the phase interpreters and to the transmitter ports, where the transmit clock is further provided to the receiver ports from the phase interpreters. The single transmit clock is provided over the analog front end, and a clock delay between the clock generator and each channel is balanced and clock phases between the channels are matched.

In one aspect of the invention, the clock phases have a channel transmit clock phase and a channel receive clock phase, where the channel transmit clock phase and channel receive clock phase are independently adjusted. In a further aspect, a signal to noise ratio is maximized by adjusting the clock phases. Additionally, the maximization utilizes a feedback algorithm.

In another aspect of the invention, the transmit clocks from the channels are selectively misaligned or aligned to control electromagnetic interference and substrate noise.

In yet another aspect of the invention, the transmit clock is provided to the channel transmit port and to the channel receive port from the phase interpolator, where the transmit clock phases and the receive clock phases are independently adjusted for each the channel. Further, the adjustment uses algorithmic feedback.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Figure 1:
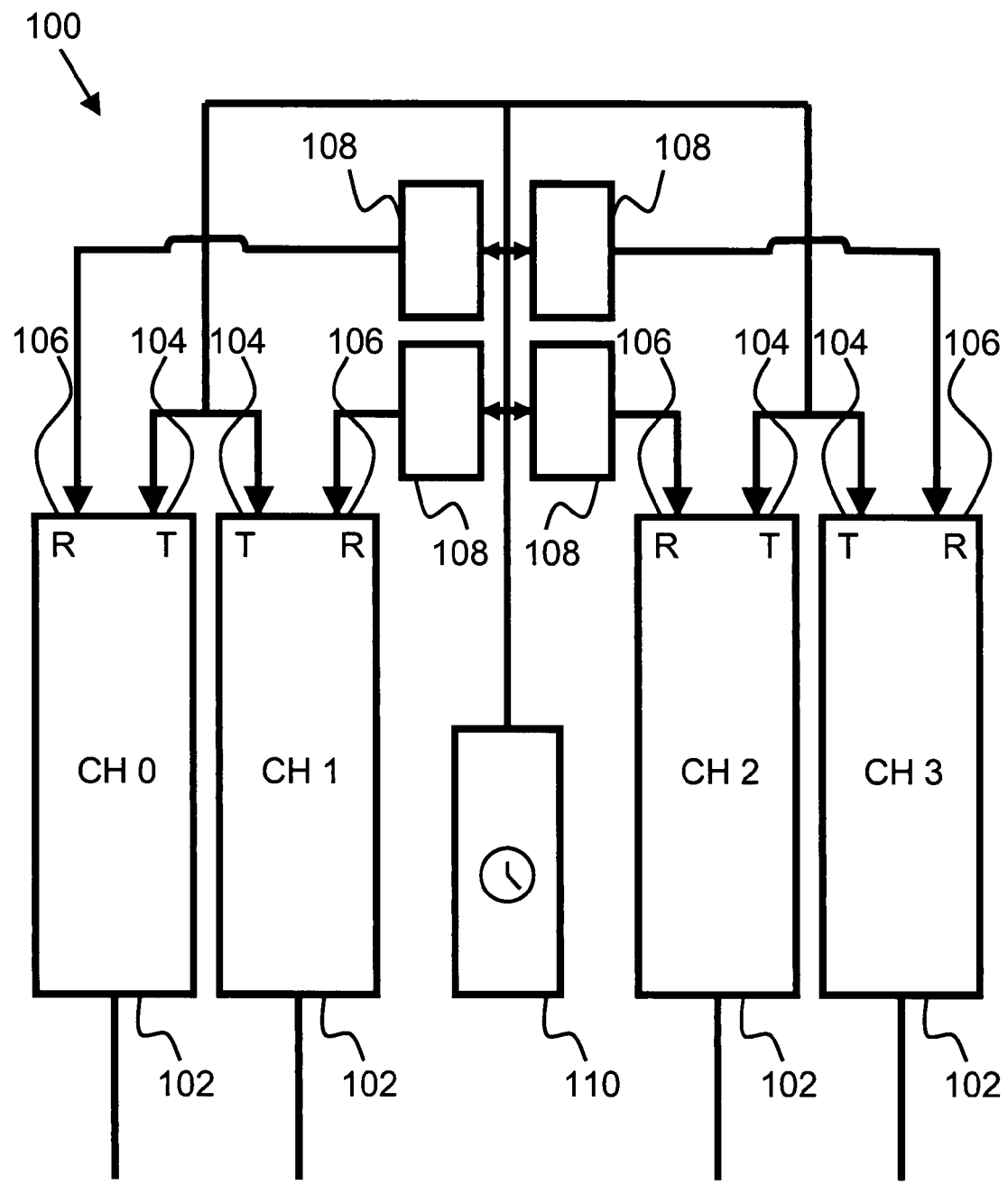
FIG. 1 shows a schematic of a clock distribution for a 10 Gbase-T analog front end according to the present invention.

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

10GBASE-T, or IEEE 802.3an-2006, is a standard to provide 10 gigabit/second connections over conventional unshielded or shielded twisted pair cables, over distances up to 100 m.

The current invention provides a clocking method that limits EMI and increases SNR, while reducing power and conserving chip space. These advances are accomplished by providing a method of simultaneous clocking of transmitters in an analog front end, and in particular an analog front end of a 10-gigabit Ethernet. Referring to the schematic drawing of a clocking tree 100 shown in FIG. 1. One embodiment of the invention includes providing at least two channels 102 to an analog front end (not shown), where the channel 102 has at least a transmitter port 104 and a receiver port 106, and providing at least two phase interpreters 108 to the analog front end, where each phase interpreter 108 is dedicated to one receiver port 106. The invention includes providing a central clock generator 110 disposed to distribute a transmit clock to the phase interpreters 108 and to the transmitter ports 104, where the transmit clock 110 is further provided to the receiver ports 106 from the phase interpreters 108. The single transmit clock 110 is provided over the analog front end, and any clock delay between the clock generator 110 and each channel 102 is balanced and clock phases between the channels 102 are matched.

In another embodiment of the invention, the clock phases can have a channel transmit clock phase and a channel receive clock phase, where the channel transmit clock phase and channel receive clock phase can be independently adjusted. Such adjustment capabilities allows the signal to noise ratio to be maximized by adjusting the clock phases. This performance optimization process can utilize a feedback algorithm.

In another embodiment of the invention, the transmit clocks from the channels 102 can be selectively misaligned or aligned to control electromagnetic interference and substrate noise.

In a further embodiment of the invention, the transmit clock 110 is provided to both the channel transmit port 104 and to the channel receive port 106 from the phase interpolator 108, where the transmit clock phases and the receive clock phases are independently adjusted for each the channel 102. The adjustment can use algorithmic feedback.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of simultaneous clocking of transmitters in an analog front end, the method comprising:
generating a central clock signal;
distributing the central clock signal to a plurality of transmitter ports, wherein each transmitter port is associated with a respective channel for the analog front end; and
distributing the central clock signal to a plurality of receiver ports, wherein each receiver port is associated with a respective one of the respective channels, wherein the central clock signal is distributed to the plurality of transmitter ports and the plurality of receiver ports, at least in part by, balancing a clock delay to each of the respective channels and matching clock phases received at the respective channels, wherein the clock phases comprise a channel transmit clock phase and a channel receive clock phase, and wherein said matching clock phases comprises independently adjusting the channel transmit clock phase and the channel receive clock phase.

2. The method of claim 1, further comprising increasing a signal-to-noise ratio by adjusting the clock phases.

3. The method of claim 2, wherein said increasing a signal-to-noise ratio comprises using a feedback algorithm.

4. A method of simultaneous clocking of transmitters in an analog front end, the method comprising:
generating a central clock signal;
distributing the central clock signal to a plurality of transmitter ports, wherein each transmitter port is associated with a respective channel for the analog front end; and
distributing the central clock signal to a plurality of receiver ports, wherein each receiver port is associated with a respective one of the respective channels, wherein the central clock signal is distributed to the plurality of transmitter ports and the plurality of receiver ports, at least in part by, balancing a clock delay to each of the respective channels and matching clock phases received at the respective channels, and wherein the central clock signal distributed to the transmitter ports is selectively misaligned or aligned to control electro-magnetic interference, substrate noise, or combinations thereof.

5. A method of simultaneous clocking of transmitters in an analog front end, the method comprising:
generating a central clock signal;
distributing the central clock signal to a plurality of transmitter ports, wherein each transmitter port is associated with a respective channel for the analog front end;
distributing the central clock signal to a plurality of receiver ports, wherein each receiver port is associated with a respective one of the respective channels, and wherein the central clock signal is distributed to the plurality of transmitter ports and the plurality of receiver ports, at least in part by, balancing a clock delay to each of the respective channels and matching clock phases received at the respective channels; and
independently adjusting a phase of the central clock signal distributed to the transmitter and receiver ports for each channel, wherein said independently adjusting a phase comprises using algorithmic feedback.

6. An analog front end comprising:
a central clock generator configured to generate a central clock signal;
a plurality of transmitter ports coupled to the central clock generator and configured to receive the central clock signal, wherein each transmitter port is associated with a respective communications channel, and wherein the respective connections between each transmitter port and the central clock generator are configured to balance a clock delay from the central clock generator to the transmitter ports;
a plurality of phase interpreters coupled to the central clock generator; and
a plurality of receiver ports, each associated with a respective communications channel and coupled to a respective one of the plurality of phase interpreters, wherein the plurality of phase interpreters are configured to match clock phases being received by the plurality of receiver ports;
wherein a phase of the central clock signal being received by the plurality of transmitter ports is configured to be independently adjusted relative to a phase of the central clock signal being received by the plurality of receiver ports; and
wherein the analog front end is configured to use a feedback algorithm to adjust the phases of the central clock signal being received by the pluralities of transmitter and receiver ports.

7. An analog front end comprising:
a central clock generator configured to generate a central clock signal;
a plurality of transmitter ports coupled to the central clock generator and configured to receive the central clock signal, wherein each transmitter port is associated with a respective communications channel, and wherein the respective connections between each transmitter port and the central clock generator are configured to balance a clock delay from the central clock generator to the transmitter ports;
a plurality of phase interpreters coupled to the central clock generator; and
a plurality of receiver ports, each associated with a respective communications channel and coupled to a respective one of the plurality of phase interpreters, wherein the plurality of phase interpreters are configured to match clock phases being received by the plurality of receiver ports;
wherein the analog front end is configured to selectively misalign or align the central clock signals being received by each of the transmitter ports.

8. The analog front end of claim 6, wherein the phase interpreters are further coupled to the plurality of transmitter ports.

9. The analog front end of claim 6, wherein the phase interpreters are further configured to independently adjust a phase of the central clock signal being received by the plurality of transmitter ports and a phase of the central clock signal being received by the plurality of receiver ports.

10. The analog front end of claim 9, wherein the phase interpreters are further configured to independently adjust a phase of the central clock signal being received by each of the communications channels.

11. An analog front end comprising:
a central clock generator configured to generate a central clock signal;
a plurality of transmitter ports coupled to the central clock generator and configured to receive the central clock signal, wherein each transmitter port is associated with a respective communications channel, and wherein the respective connections between each transmitter port and the central clock generator are configured to balance a clock delay from the central clock generator to the transmitter ports;

a plurality of phase interpreters coupled to the central clock generator and configured to independently adjust a phase of the central clock signal being received by the plurality of transmitter ports and a phase of the central clock signal being received by the plurality of receiver ports, wherein the phase interpreters are further configured to use algorithmic feedback to independently adjust the phases; and a plurality of receiver ports, each associated with a respective communications channel and coupled to a respective one of the plurality of phase interpreters, wherein the plurality of phase interpreters are configured to match clock phases being received by the plurality of receiver ports.

12. A synchronous digital system comprising:

a plurality of transmitter ports, each configured to couple to a respective communications channel;

a central clock generator configured to generate a central clock signal;

a clock distribution network configured to distribute the central clock signal to each of the plurality of transmitter ports such that a clock delay is provided from the central clock generator to each of the transmitter ports;

a plurality of receiver ports, each configured to couple to a respective one of the communications channels; and a plurality of phase interpreters, each configured to receive the central clock signal and adjust a phase of the central clock signal, wherein the plurality of phase interpreters are further configured to distribute the phase-adjusted central clock signal to a respective one of the plurality of receiver ports such that phases between each of the communications channels are approximately matched; and wherein the plurality of phase interpreters are further coupled to respective ones of the plurality of transmitter ports and further configured to independently adjust a phase of the central clock signal being distributed to the respective transmitter and receiver ports.

13. The method of claim 1, wherein the analog front end is a 10GbaseT analog front end.

14. The method of claim 4, wherein the analog front end is a 10GbaseT analog front end.

15. The method of claim 5, wherein the analog front end is a 10GbaseT analog front end.

16. The synchronous digital system of claim 12, wherein the central clock generator is further configured to simultaneously clock each of the transmitter ports.

17. The analog front end of claim 7, wherein the phase interpreters are further coupled to the plurality of transmitter ports.

18. The analog front end of claim 7, wherein the phase interpreters are further configured to independently adjust a phase of the central clock signal being received by the plurality of transmitter ports and a phase of the central clock signal being received by the plurality of receiver ports.

19. The analog front end of claim 18, wherein the phase interpreters are further configured to independently adjust a phase of the central clock signal being received by each of the communications channels.

* * * * *

UNITED STATES PATENT AND TRADEMARK OFFICE
CERTIFICATE OF CORRECTION

| | | |
|---|---|---|
| PATENT NO. | : 7,983,373 B2 | Page 1 of 1 |
| APPLICATION NO. | : 11/975740 | |
| DATED | : July 19, 2011 | |
| INVENTOR(S) | : Dyer et al. | |

It is certified that error appears in the above-identified patent and that said Letters Patent is hereby corrected as shown below:

Column 6, line 12, in Claim 13, delete "10GbaseT" and insert -- 10Gbase-T --.

Column 6, line 14, in Claim 14, delete "10GbaseT" and insert -- 10Gbase-T --.

Column 6, line 16, in Claim 15, delete "10GbaseT" and insert -- 10Gbase-T --.

Signed and Sealed this
Twenty-ninth Day of November, 2011

David J. Kappos
*Director of the United States Patent and Trademark Office*